(12) United States Patent
Kuramoto

(10) Patent No.: US 11,805,599 B2
(45) Date of Patent: Oct. 31, 2023

(54) ELECTRONIC DEVICE

(71) Applicant: KYOCERA Corporation, Kyoto (JP)

(72) Inventor: Yoshio Kuramoto, Hioki (JP)

(73) Assignee: KYOCERA CORPORATION, Kyoto (JP)

( * ) Notice: Subject to any disclaimer, the term of this patent is extended or adjusted under 35 U.S.C. 154(b) by 2 days.

(21) Appl. No.: 17/638,075

(22) PCT Filed: Jun. 29, 2020

(86) PCT No.: PCT/JP2020/025597
§ 371 (c)(1),
(2) Date: Feb. 24, 2022

(87) PCT Pub. No.: WO2021/039096
PCT Pub. Date: Mar. 4, 2021

(65) Prior Publication Data
US 2022/0279650 A1    Sep. 1, 2022

(30) Foreign Application Priority Data
Aug. 27, 2019  (JP) ................. 2019-154451

(51) Int. Cl.
*H05K 1/03*      (2006.01)
*H01S 5/02315*   (2021.01)
(Continued)

(52) U.S. Cl.
CPC ......... *H05K 1/0306* (2013.01); *H01S 5/0206* (2013.01); *H01S 5/02208* (2013.01);
(Continued)

(58) Field of Classification Search
CPC .................... H05K 1/0306; H05K 1/0203
See application file for complete search history.

(56) References Cited

U.S. PATENT DOCUMENTS 7,293,898 B2   11/2007   Kumthampinji et al.
8,568,001 B2   10/2013   Daily et al.
(Continued)

FOREIGN PATENT DOCUMENTS

JP    2013-162127 A    8/2013
JP    2018-156919 A    10/2018
(Continued)

*Primary Examiner* — Sherman Ng
(74) *Attorney, Agent, or Firm* — PROCOPIO CORY HARGREAVES AND SAVITCH LLP

(57) ABSTRACT

An electronic device (1, and 1A to 1E) according to the present disclosure include a substrate (10, and 10F) made of a ceramic and a housing part (21) including a recessed portion (210) accommodating the substrate. The recessed portion includes a plurality of side wall portions (211) arranged around the substrate along a circumferential direction and respectively facing a plurality of sides (111) of the substrate in a plan view when viewing the substrate from a direction perpendicular to a circuit forming surface (110) of the substrate, and a plurality of gaps (212) each located between two of the plurality of side wall portions adjacent to each other in the circumferential direction. The substrate includes a plurality of corner portions (112) curved toward an inner side of the circuit forming surface in a plan view.

10 Claims, 6 Drawing Sheets

(51) Int. Cl.
  *H01S 5/02*      (2006.01)
  *H01S 5/02208*   (2021.01)
  *H01L 33/48*     (2010.01)
  *H01S 5/024*     (2006.01)

(52) U.S. Cl.
  CPC ........ *H01S 5/02315* (2021.01); *H01L 33/486* (2013.01); *H01S 5/02469* (2013.01)

(56)                    References Cited

U.S. PATENT DOCUMENTS

| | | |
|---|---|---|
| 2005/0040510 A1 | 2/2005 | Hashimoto |
| 2011/0273895 A1 | 11/2011 | Uemoto et al. |
| 2013/0223083 A1 | 8/2013 | Kimiya et al. |
| 2016/0095217 A1 | 3/2016 | Kurauchi et al. |
| 2017/0082257 A1 | 3/2017 | Yoon |
| 2018/0175530 A1* | 6/2018 | Fukui .................. H01R 12/727 |
| 2018/0309912 A1* | 10/2018 | Park ....................... H04N 23/51 |
| 2020/0177775 A1 | 6/2020 | Park et al. |
| 2022/0103724 A1 | 3/2022 | Park et al. |

FOREIGN PATENT DOCUMENTS

| | | |
|---|---|---|
| JP | 2019-102227 A | 6/2019 |
| WO | 01/26432 A1 | 4/2001 |
| WO | 2007/128070 A1 | 11/2007 |
| WO | 2011/039998 A1 | 4/2011 |
| WO | 2017/069550 A1 | 4/2017 |

\* cited by examiner

ELECTRONIC DEVICE

TECHNICAL FIELD

The present disclosure relates to an electronic device.

BACKGROUND ART

Since a substrate made of a ceramic has superior insulating properties, superior thermal conductivity, and the like, the substrate may be utilized as a substrate for a lighting device such as an on-board lamp.

The lighting device includes a substrate in which a light emitting element such as a light emitting diode and a wiring or the like are located, and a socket for accommodating the substrate.

Here, Patent Document 1 discloses a socket including a notch at a location where a corner portion of a substrate is located.

CITATION LIST

Patent Literature

Patent Document 1: JP 2019-102227 A

SUMMARY OF INVENTION

Technical Problem

However, in the conventional technology described above, since the corner portion of the substrate is exposed, for example, when receiving an impact from outside, chips and cracks may occur in the corner portion of the substrate.

The present disclosure has been made in view of the above, and an object thereof is to provide an electronic device which can suppress damage to the corner portion of the substrate while using a housing part in which the corner portion of the substrate is exposed.

Solution to Problem

An electronic device according to an aspect of the present disclosure includes a substrate made of a ceramic, and a housing part including a recessed portion for accommodating the substrate. The recessed portion includes a plurality of side wall portions arranged around the substrate along a circumferential direction and respectively facing one of a plurality of sides of the substrate in a plan view when viewing the substrate from a direction perpendicular to a circuit forming surface of the substrate, and a plurality of gaps each located between two of the plurality of side wall portions adjacent to each other in the circumferential direction. The substrate includes a plurality of corner portions curved toward an inner side of the circuit forming surface in a plan view.

Advantageous Effects of Invention

According to the present disclosure, damage to a corner portion of a substrate can be suppressed while using a socket in which the corner portion of the substrate is exposed.

DESCRIPTION OF EMBODIMENTS

Figure 1:
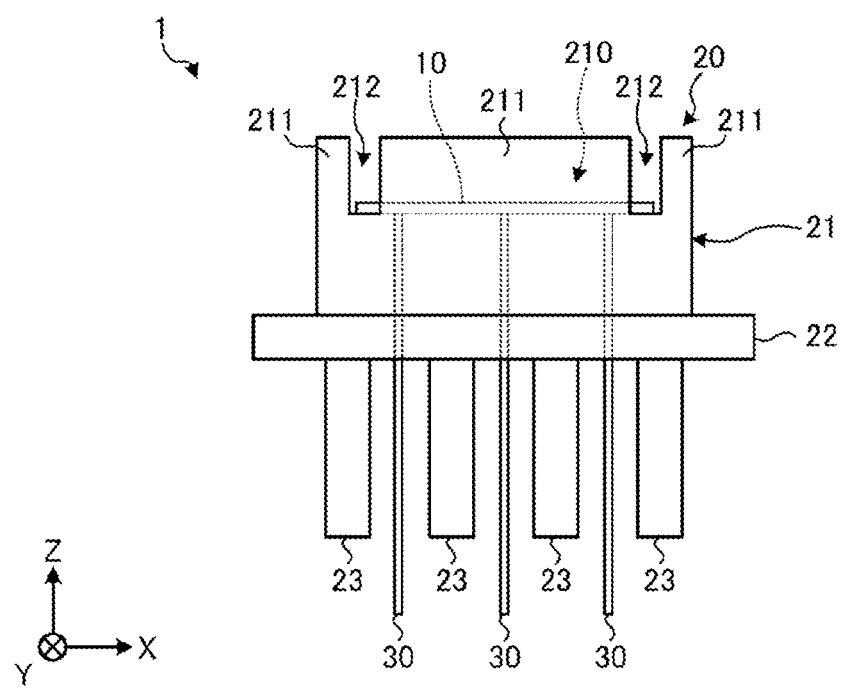
FIG. 1 is a schematic side view of a lighting device according to an embodiment.

Modes (hereinafter, referred to as "embodiments") for implementing an electronic device according to the present disclosure will be described in detail below with reference to the drawings. Note that the embodiments described below are not intended to limit the electronic device according to the present disclosure. Each of the embodiments can be appropriately combined within a range in which the processing contents do not contradict each other. In each of the embodiments below, the same reference numerals are assigned to the same portions, and redundant descriptions thereof will be omitted.

In the embodiments described below, expressions such as "constant", "orthogonal", "vertical," and "parallel" may be used, but these expressions do not need to be exactly "constant", "orthogonal", "vertical," and "parallel". In other words, each of the above-described expressions allows for deviations in, for example, manufacturing accuracy, positioning accuracy, and the like.

In each of the drawings referred below, for ease of explanation, an X-axis direction, a Y-axis direction, and a Z-axis direction that are orthogonal to each other may be defined to illustrate an orthogonal coordinate system in which the Z-axis positive direction is the vertically upward direction.

In the embodiments described below, examples will be described in which the electronic device according to the present disclosure is applied to a lighting device.

Figure 2:
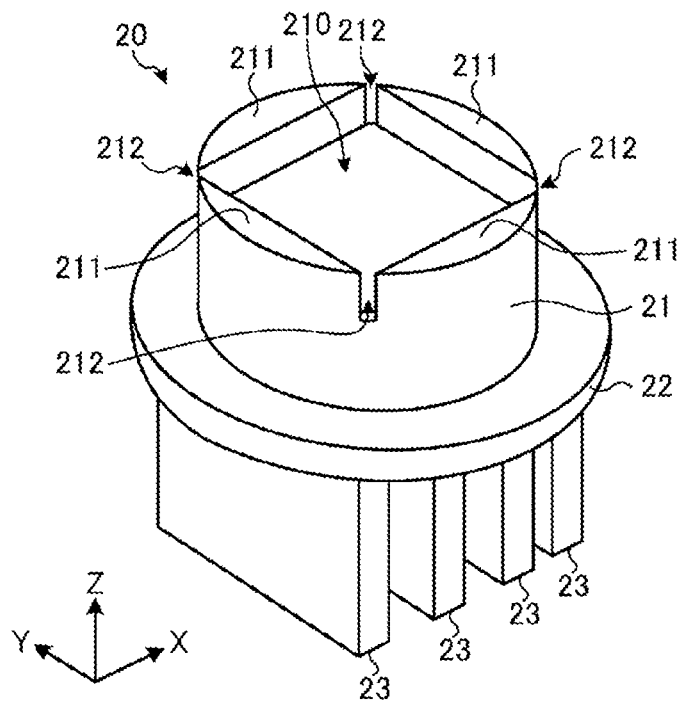
FIG. 2 is a schematic perspective view of a socket according to an embodiment.
Figure 3:
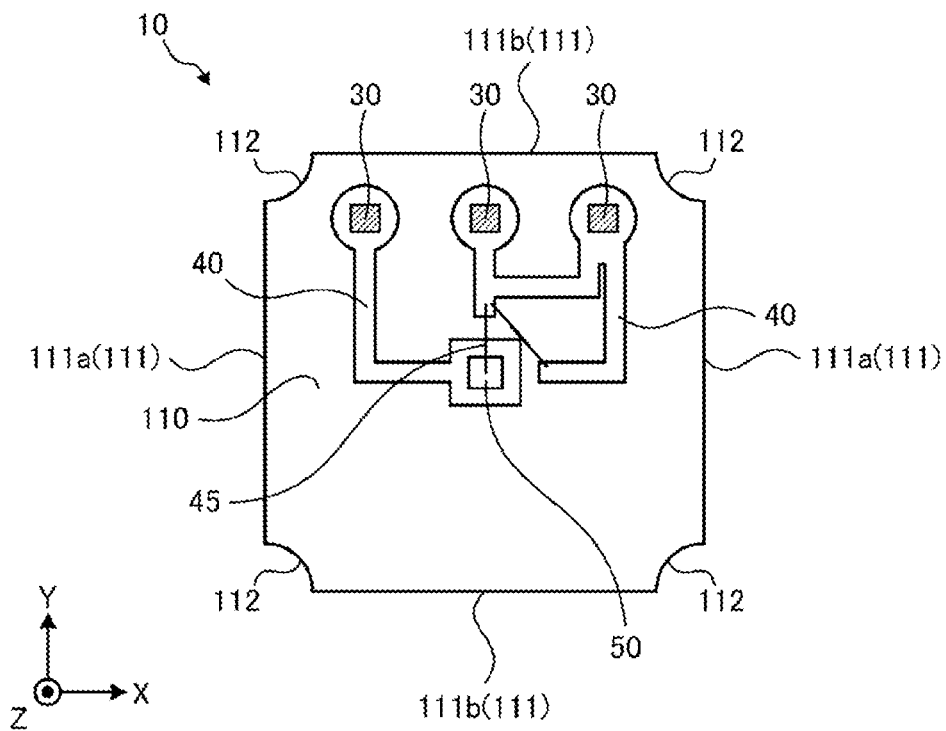
FIG. 3 is a schematic plan view of a substrate according to an embodiment.

First, a configuration of the lighting device 1 according to an embodiment will be described with reference to FIGS. 1 to 3. FIG. 1 is a schematic side view illustrating the lighting device according to the embodiment. FIG. 2 is a schematic perspective view of a socket according to the embodiment. FIG. 3 is a schematic plan view of a substrate according to the embodiment.

As illustrated in FIG. 1, a lighting device 1 according to the embodiment includes a substrate 10 made of a ceramic, a socket 20 for accommodating the substrate 10, and a plurality of electrically conductive terminals 30 connected to the substrate 10. The lighting device 1 is used, as, for example, an on-board lighting device. Specifically, the lighting device 1 is used as a light source such as a rear lamp, a turn lamp, a position lamp, and a fog lamp.

As illustrated in FIGS. 1 and 2, the socket 20 includes a housing part 21, a flange part 22, and a plurality of heat dissipating fins 23.

The housing part 21 is, for example, a bottomed tubular portion having a substantially circular shape in a plan view, and is located on a surface opposite a surface on which the plurality of heat dissipating fins 23 are located in the flange part 22 described below. The housing part 21 includes a recessed portion 210 recessed from an end surface of the socket 20, specifically from a surface opposite a surface in contact with the flange part 22 of the housing part 21, toward the other end side of the socket 20. The substrate 10 is accommodated in the recessed portion 210.

The recessed portion 210 includes a plurality of side wall portions 211. The plurality of side wall portions 211 have, for example, an arcuate shape in a plan view, and are arranged along a circumferential direction around the substrate 10 so as to surround the substrate 10.

Gaps 212 are provided each between two of the plurality of side wall portions 211 adjacent to each other in the circumferential direction.

The flange part 22 is, for example, a disc-shaped portion, and is located between the housing part 21 and the plurality of heat dissipating fins 23. The flange part 22 has a larger diameter than that of the housing part 21, and when the lighting device 1 is inserted into, for example, a mounting hole provided in the vehicle body, the flange part 22 comes into contact with a peripheral edge of the mounting hole. A bayonet (not illustrated) for a twist lock is located on an outer peripheral surface of the housing part 21, and by rotating the socket 20 in a state where the flange part 22 is in contact with the peripheral edge of the mounting hole, the bayonet is fitted into a groove on the vehicle body side, so that the lighting device 1 is in a state of being fixed to the vehicle body.

The plurality of heat dissipating fins 23 are located on a surface opposite a surface on which the housing part 21 is located in the flange part 22. Heat generated in the substrate 10 is emitted primarily from the plurality of heat dissipating fins 23. Here, the example is given in which the socket 20 includes four heat dissipating fins 23, but the number of the heat dissipating fins 23 of the socket 20 is not limited to four.

Note that a heat transfer member (not illustrated) formed of, for example, a metal such as aluminum is located between a bottom portion of the recessed portion 210 and the substrate 10. The heat transfer member is located so as to be in contact with the substrate 10 and the bottom portion of the recessed portion 210, and transmits the heat generated in the substrate 10 to the heat dissipating fins 23.

As illustrated in FIG. 3, the substrate 10 is a member having a flat plate shape, and including a circuit forming surface 110 (here, a front surface) serving as a first surface, a second surface (here, a rear surface) located opposite the circuit forming surface 110, and a third surface (here, a side surface) connected to each of the circuit forming surface 110 and the second surface. The substrate 10 is accommodated in the housing part 21 in a state where the second surface faces the bottom surface of the recessed portion 210, in other words, in a state where the circuit forming surface 110 faces the front.

Examples of the ceramic used for the substrate 10 include an aluminum oxide-based ceramic, a zirconium oxide-based ceramic, a composite ceramic of aluminum oxide and zirconium oxide, a silicon nitride-based ceramic, an aluminum nitride-based ceramic, a silicon carbide-based ceramic, and a mullite ceramic. Note that the substrate 10 made of the aluminum oxide-based ceramic has mechanical strength required for the substrate 10, and has superior workability. The substrate 10 made of the aluminum nitride-based ceramic has high thermal conductivity, and thus has superior heat radiating properties.

Wirings 40 containing a metal such as copper, silver, or the like as a main constituent are located on the circuit forming surface 110. The wirings 40 are electrically connected to electrically conductive terminals 30 via an electrically conductive bonding material (not illustrated) such as a brazing material or a solder.

A light emitting element 50 is located on the wirings 40. The light emitting element 50 is, for example, a light emitting diode (LED), a laser diode (LD), or the like.

Note that the shape and the arrangement of the wirings 40 and the light emitting element 50 are illustrated as an example in FIG. 3. For example, in FIG. 3, the example is illustrated in which the light emitting element 50 located on one of the wirings 40 and the other one of wirings 40 are electrically connected by a bonding wire 45, but a method of connecting the wiring 40 and the light emitting element 50 is not limited to the example illustrated in FIG. 3. Although not illustrated here, other than the wirings 40 and the light emitting element 50, a resistor or the like is located on the circuit forming surface 110.

As illustrated in FIG. 3, the circuit forming surface 110 of the substrate 10 includes four sides 111 and four corner portions 112. The four sides 111 include two first sides 111a parallel to each other and two second sides 111b parallel to each other. The two first sides 111a extend along the Y-axis direction, and the two second sides 111b extend along the X-axis direction. In other words, the first sides 111a and the second sides 111b are orthogonal to each other. Each of the four corner portions 112 is located between one of the first sides 111a and one of the second sides 111b. The two first sides 111a, the two second sides 111b, and the four corner portions 112 are continuous in the order of one of the first sides 111a, one of the corner portions 112, one of the second sides 111b, one of the corner portions 112, the other one of the first sides 111a, one of the corner portions 112, the other one of the second sides 111b, and one of the corner portions 112. The second surface of the substrate 10 has the same shape as the circuit forming surface 110.

Figure 4:
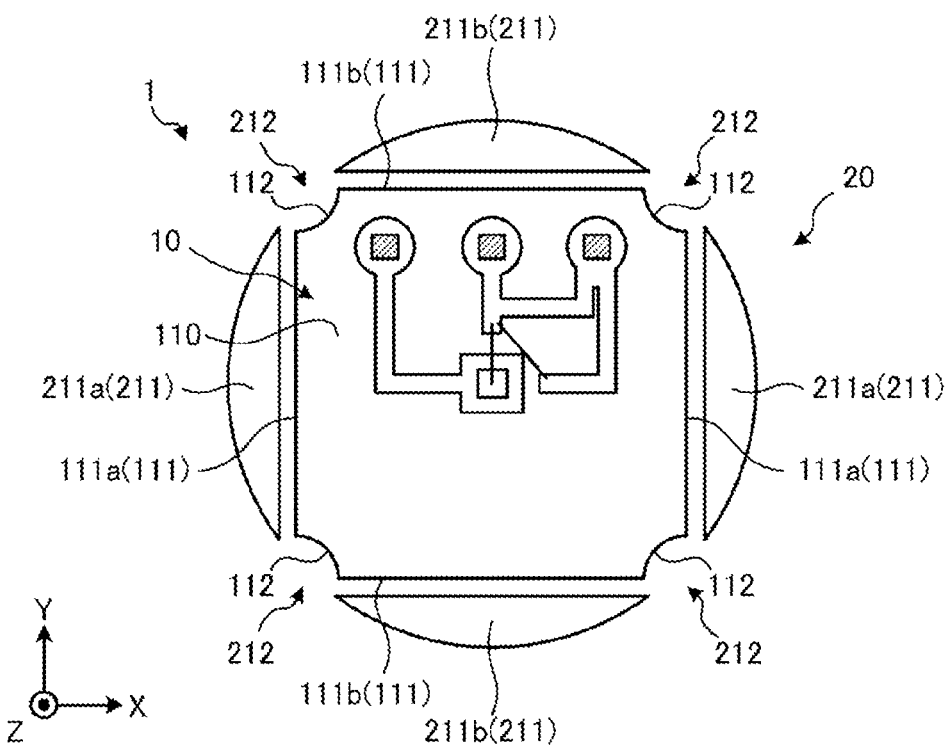
FIG. 4 is a schematic plan view of the lighting device according to the embodiment.

Next, a relationship between the plurality of side wall portions 211 provided in the socket 20 and the substrate 10 will be described with reference to FIG. 4. FIG. 4 is a schematic plan view of a lighting device according to the embodiment. Note that, in FIG. 4, for ease of understanding, a part of a configuration of the socket 20 such as the flange part 22 is not illustrated.

As illustrated in FIG. 4, the four side wall portions 211 of the socket 20 respectively face corresponding one of the four sides 111 of the circuit forming surface 110. Specifically, each of first side wall portions 211a facing one of the first sides 111a extend in the Y-axis direction in the same manner as the first sides 111a, and is located outward in the X-axis direction of the corresponding one of the first sides 111a. Each of second side wall portions 211b facing one of the second sides 111b extends in the X-axis direction in the same manner as the second sides 111b, and is located outward in the Y-axis direction of the corresponding one of the first sides 111a.

In this way, since each of the side wall portions 211 is located in the socket 20 so as to face corresponding one of the sides 111 of the substrate 10, each of sides 111 of the substrate 10 can be protected even when the lighting device 1 receives an external impact, for example. In the embodiment, since each of the side wall portions 211 is longer than the facing one of sides 111, an end portion of the facing one of sides 111 can be reliably protected. More specifically, since both end portions of each of the side wall portions 211 in the extending direction are located outward in the extending direction than both end portions of the facing one of the sides 111, the both end portions of the facing one of the sides 111 can be reliably protected, and thus reliability in the vibration environment of the lighting device 1 mounted on the vehicle can be improved.

By positioning each of the side wall portions 211 so as to face the corresponding one of the sides 111 of the substrate 10, the heat generated in the substrate 10 can be dissipated from each of the sides 111 of the substrate 10 to the corresponding one of the side wall portions 211.

On the other hand, as described above, each of the gaps 212 is located between side wall portions 211 adjacent to each other, that is, between one of the first side wall portions 211a and corresponding one of the second side wall portions 211b. The gaps 212 are provided, for example, so that the corner portions of the substrate do not interfere with the recessed portion due to the miniaturization of the socket. Further, the gaps 212 are provided, for example, to prevent the heat generated in the substrate from being kept in the recessed portion.

Each of the gaps 212 is located between one of the first side wall portions 211a facing one of the first sides 111a and one of the second side wall portions 211b facing one of the second sides 111b. Each of the corner portions 112 is located between corresponding one of the first sides 111a and corresponding one of the second sides 111b. Thus, when viewing the inside of the recessed portion 210 from the side of the lighting device 1 over the gaps 212, each of the corner portions 112 of the substrate 10 is located at a location visible from corresponding one of the gaps 212.

In this way, when the lighting device 1 is viewed from the side, the corner portions 112 of the substrate 10 are exposed from the recessed portion 210. Thus, when the lighting device 1 receives the external impact, the corner portions 112 of the substrate 10 are considered to be more likely to be chipped or cracked by such an impact than the sides 111 of the substrate 10 protected by the side wall portions 211.

On the other hand, as illustrated in FIG. 3, the substrate 10 according to the embodiment includes the corner portions 112 having an inverted-R shape curved toward the inside of the circuit forming surface 110 in a plan view of the substrate 10 from a direction perpendicular to the circuit forming surface 110.

The corner portions 112 having the inverted-R shape have a larger margin with respect to the gaps 212 than a case where the corner portions are not chamfered or the corner portions are chamfered into a C-plane shape. In other words, the corner portions 112 having the inverted-R shape are located at a position further away from the gaps 212 than the case where the corner portions are not chamfered or the case where the corner portions are chamfered into the C-plane shape. Thus, the corner portions 112 having the inverted-R shape are less likely to be damaged over the gaps 212.

By configuring the corner portions 112 to have the inverted-R shape, the heat capacity of the entirety of the substrate 10 can be reduced as compared with the case where the corner portions are not chamfered or the case where the corner portions are chamfered into the C-plane shape. As a result, heat accumulation in the substrate 10 can be suppressed. By configuring the corner portions 112 to have the inverted-R shape, a surface area of the corner portions 112 can be increased as compared with the case where the corner portion is not chamfered or the case where the corner portion is chamfered in a C-plane shape. Accordingly, heat radiation from the corner portions 112 can be increased, and heat can be efficiently dissipated from the corner portions 112 to the exterior of the socket 20 via the gaps 212.

Note that the shape of the corner portions 112 when viewing the substrate 10 from a direction perpendicular to the circuit forming surface 110 corresponds to, for example, one arc (quarter arc) obtained by equally dividing one circle into four. The substrate used in the lighting device may be formed by obtaining a large number of substrates from one single large substrate. The large substrate is provided with a plurality of slits in the longitudinal direction and the horizontal direction for splitting, and by providing through-holes having circular shape at positions where the slits in the longitudinal direction and the slits in the horizontal direction intersect with each other, each of the corner portions 112 having the inverted-R shape can be formed at four corner portions of each of the substrates 10 serving as individual pieces. In this way, configuring of the corner portions 112 in a quarter arc shape can enhance productivity in the case where the large number of substrates 10 is obtained from the one single large substrate can be improved. By configuring the through-holes in a circular shape, cracking due to stress concentration can be less likely to occur as compared with a case where through-holes having rectangular shape are used, for example.

FIRST MODIFIED EXAMPLE

Figure 5:
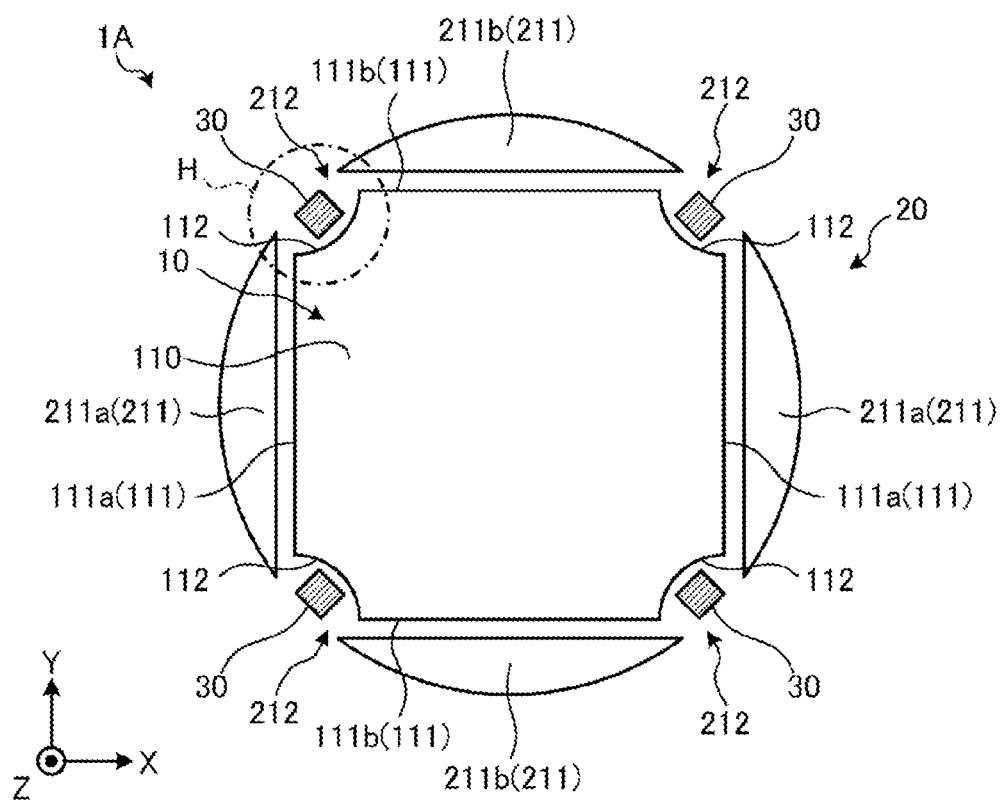
FIG. 5 is a schematic plan view of a lighting device according to a first modified example.
Figure 6:
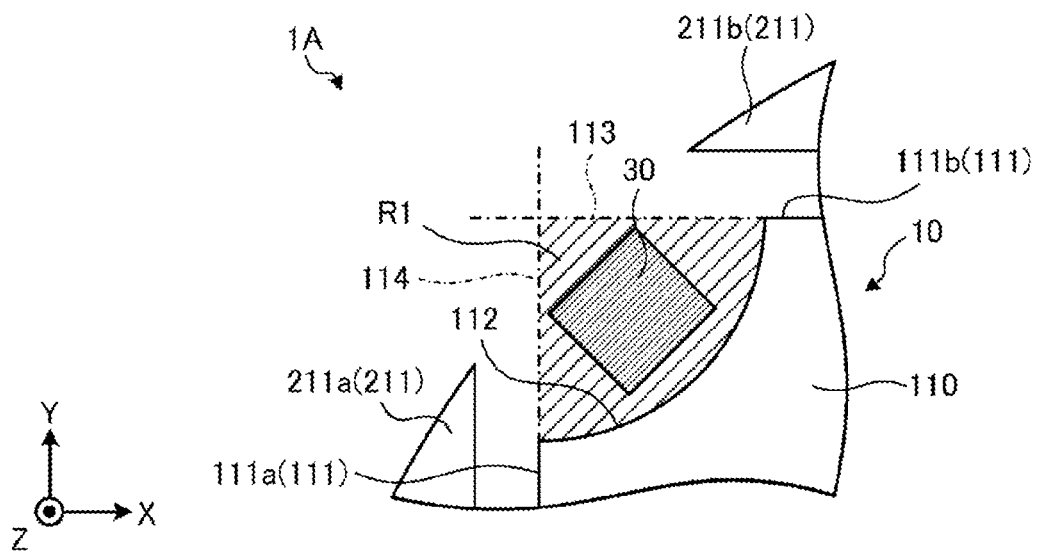
FIG. 6 is a schematic enlarged view of an H portion in FIG. 5.

Next, a modified example of the lighting device 1 according to the embodiments described above will be described below. First, the configuration example of a lighting device according to a first modified example will be described with reference to FIGS. 5 and 6. FIG. 5 is a schematic plan view of a lighting device according to the first modified example. FIG. 6 is a schematic enlarged view of a portion H in FIG. 5. Note that, in FIG. 5, for ease of understanding, a part of a configuration of the socket 20 such as the flange part 22, and the wirings 40, the light emitting element 50, and the like on the substrate 10 are not illustrated.

As illustrated in FIG. 5, in a lighting device 1A according to the first modified example, each of the electrically conductive terminals 30 is located in a recessed region of corresponding one of the corner portions 112. Here, an example is given in which each one of the four electrically conductive terminals 30 included in the lighting device 1A is located in the recessed region of the corresponding one of the four corner portions 112.

In this way, by positioning each of the electrically conductive terminals 30 in the recessed region of the corresponding one of the corner portions 112, the circuit mounting region of the circuit forming surface 110 can be more widely ensured than a case where the electrically conductive terminals 30 are located on the circuit forming surface 110 of the substrate 10.

As illustrated in FIG. 5, in the lighting device 1A, the four side wall portions 211 and the four electrically conductive terminals 30 are alternately arranged along the circumferential direction. By alternately arranging the side wall portions 211 and the electrically conductive terminals 30, since the heat generation points are dispersed as compared with a case where, for example, the plurality of electrically conductive terminals 30 are concentrated in one place, the thermal uniformity of the substrate 10 can be increased. Note that the lighting device 1A does not necessarily include the same number of electrically conductive terminals 30 as the number of the corner portions 112. In other words, the side wall portions 211 and the electrically conductive terminals 30 may be alternately arranged at least in part in the circumferential direction.

As illustrated in FIG. 6, the recessed region of each of the corner portions 112 corresponds to a region R1 surrounded by virtual extended lines 113 and 114 of one of the first sides 111a and one of the second sides 111b adjacent to one of the corner portions 112 and the one of the corner portions 112. Here, an example is given in which each of the electrically conductive terminals 30 entirely fits in the region R1, but at least a portion of each of the electrically conductive terminals 30 may be located in the region R1. In other words, each of the electrically conductive terminals 30 may partially protrude from the region R1.

SECOND MODIFIED EXAMPLE

Figure 7:
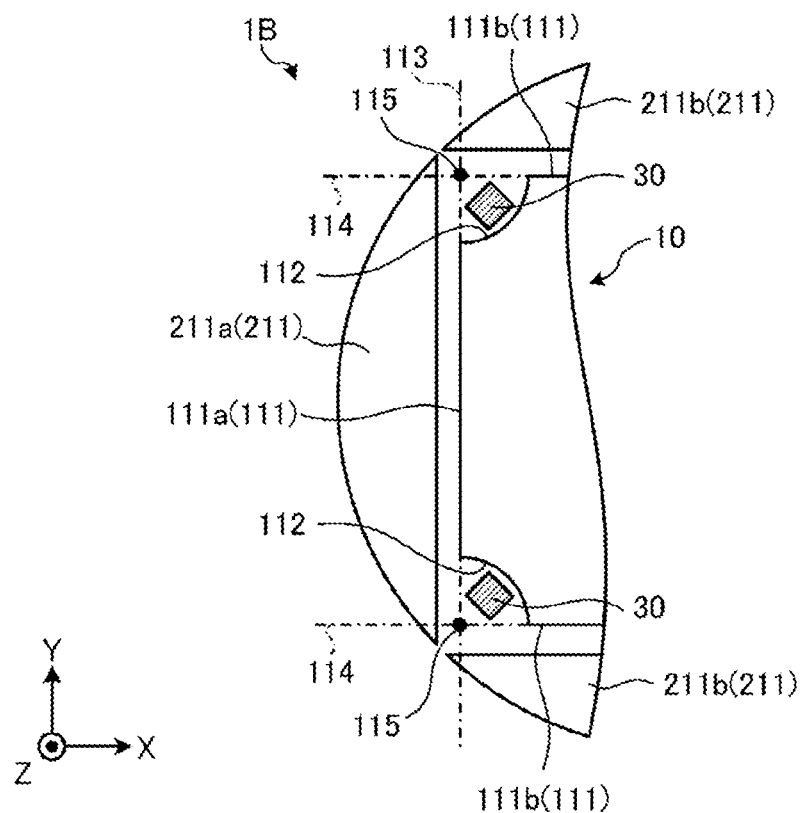
FIG. 7 is a schematic plan view of a lighting device according to a second modified example.

Next, a configuration example of a lighting device according to a second modified example will be described with reference to FIG. 7. FIG. 7 is a schematic plan view of the lighting device according to the second modified example.

As illustrated in FIG. 7, in a lighting device 1B according to the second modified example, similar to the lighting device 1A according to the first modified example, each of the electrically conductive terminals 30 is located in a recessed region of corresponding one of the corner portions 112.

In the lighting device 1B according to the second modified example, for example, each of the first side wall portions 211a is longer than a line segment connecting intersection points 115 and 115 between a virtual extended line 113 of facing one of the first sides 111a and virtual extended lines 114 and 114 of two second sides 111b adjacent to the corresponding one of the first sides 111a via corresponding one of the corner portions 112. The same applies to the second side wall portions 211b, and each of the second side wall portions 211b is longer than a line segment connecting intersection points 115 and 115 (one of them is not illustrated) between a virtual extended line 114 of facing one of the second sides 111b and virtual extended lines 113 and 113 (one of them is not illustrated) of two first sides 111a adjacent to the corresponding one of the second sides 111b via corresponding one of the corner portions 112.

With such a configuration, substantially the entirety of each of the electrically conductive terminals 30 can be covered with two side wall portions 211 (one of the first side wall portions 211a and one of the second side wall portions 211b). As a result, the reliability in the vibration environment of the lighting device 1 mounted on the vehicle can be further improved.

Note that the side wall portions 211 may be configured to cover a portion of each of the electrically conductive terminals 30. For example, each of the first side wall portions 211a may be shorter than the line segment connecting the intersection points 115 and 115 between the virtual extended line 114 of facing one of the first sides 111a and the virtual extended lines 113 and 113 of two second sides 111b adjacent to the corresponding one of the first sides 111a via corresponding one of the corner portions 112. This corresponds to, for example, the configuration illustrated in FIG. 6. Even with such a configuration, each of the electrically conductive terminals 30 can be protected by the two side wall portions 211 (one of the first side wall portions 211a and one of the second side wall portions 211b), and thus improving the reliability in the vibration environment of the lighting device 1.

THIRD MODIFIED EXAMPLE

Figure 8:
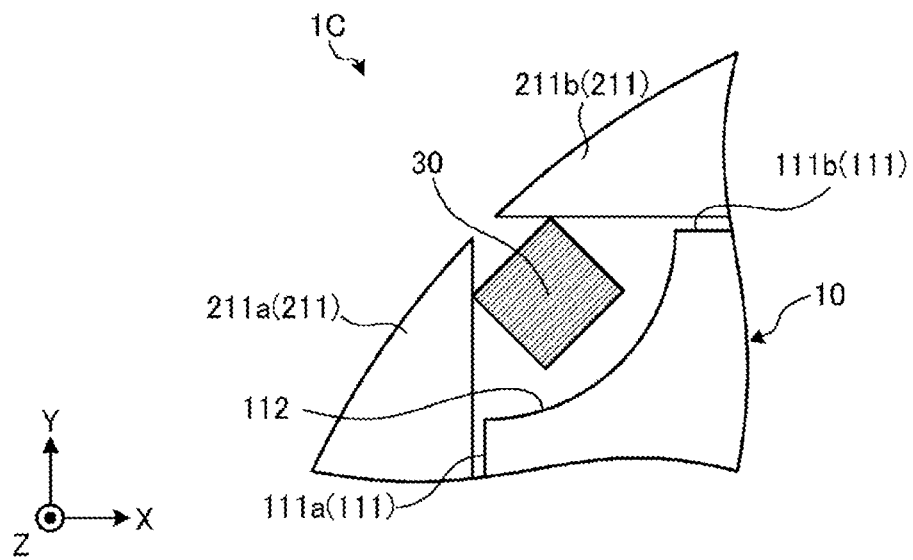
FIG. 8 is a schematic plan view of a lighting device according to a third modified example.

Next, a configuration of a lighting device according to a third modified example will be described with reference to FIG. 8. FIG. 8 is a schematic plan view of the lighting device according to the third modified example. Note that the periphery of the corner portion 112 is illustrated enlarged in FIG. 8.

As illustrated in FIG. 8, in a lighting device 1C according to the third modified example, the electrically conductive terminal 30 is in contact with two side wall portions 211 adjacent to each other (the first side wall portion 211a and the second side wall portion 211b). In this way, by bringing the electrically conductive terminal 30 into contact with the side wall portions 211, for example, the vibration of the electrically conductive terminal 30 can be suppressed by the side wall portions 211. Accordingly, the reliability in the vibration environment of the lighting device 1 can be further improved. Further, when the electrically conductive terminal 30 generates heat, the heat generated at the electrically conductive terminal 30 can be efficiently dissipated to the side wall portions 211.

FOURTH MODIFIED EXAMPLE

Figure 9:
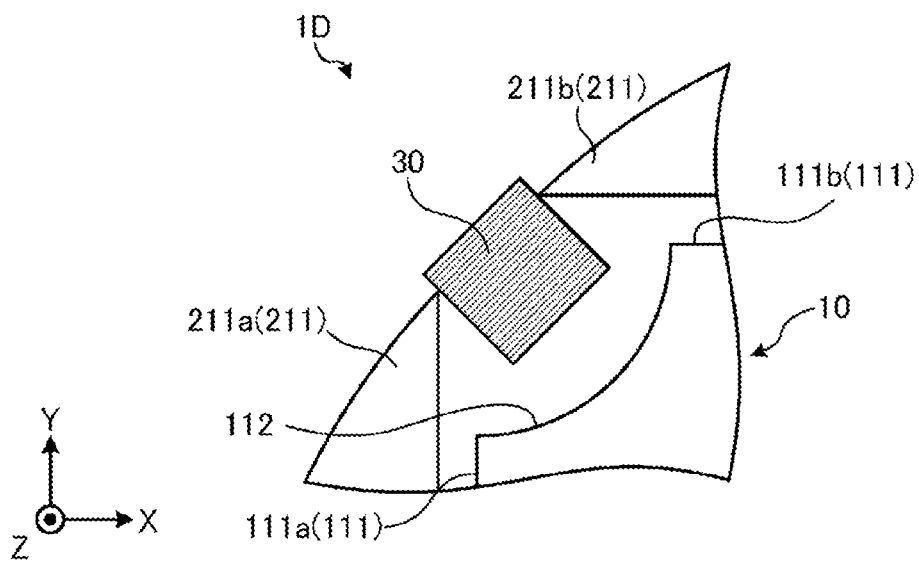
FIG. 9 is a schematic plan view of a lighting device according to a fourth modified example.

Next, a configuration of a lighting device according to a fourth modified example will be described with reference to FIG. 9. FIG. 9 is a schematic plan view of the lighting device according to the fourth modified example. Note that the periphery of the corner portion 112 is illustrated enlarged in FIG. 9.

As illustrated in FIG. 9, in a lighting device 1D according to the fourth modified example, the electrically conductive terminal 30 is sandwiched between two adjacent side wall portions 211 (the first side wall portion 211a and the second side wall portion 211b).

In this way, by sandwiching the electrically conductive terminal 30 between the two side wall portions 211, similar to the lighting device 1C according to the third modified example, the vibration of the electrically conductive terminal 30 can be suppressed by the side wall portions 211. Further, when the electrically conductive terminal 30 generates heat, the heat generated at the electrically conductive terminal 30 can be efficiently dissipated to the side wall portions 211.

By sandwiching the electrically conductive terminal 30 between the two side wall portions 211, the electrically conductive terminal 30 can be fixed by the two side wall portions 211. Thus, for example, the amount of adhesive or the like used to fix the electrically conductive terminal 30 can be reduced.

FIFTH MODIFIED EXAMPLE

Figure 10:
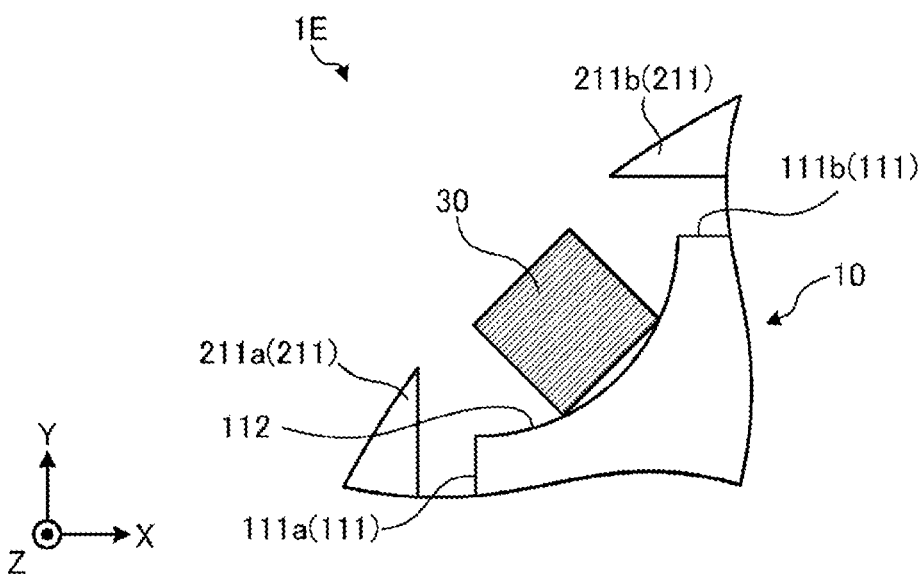
FIG. 10 is a schematic plan view of a lighting device according to a fifth modified example.
Figure 11:
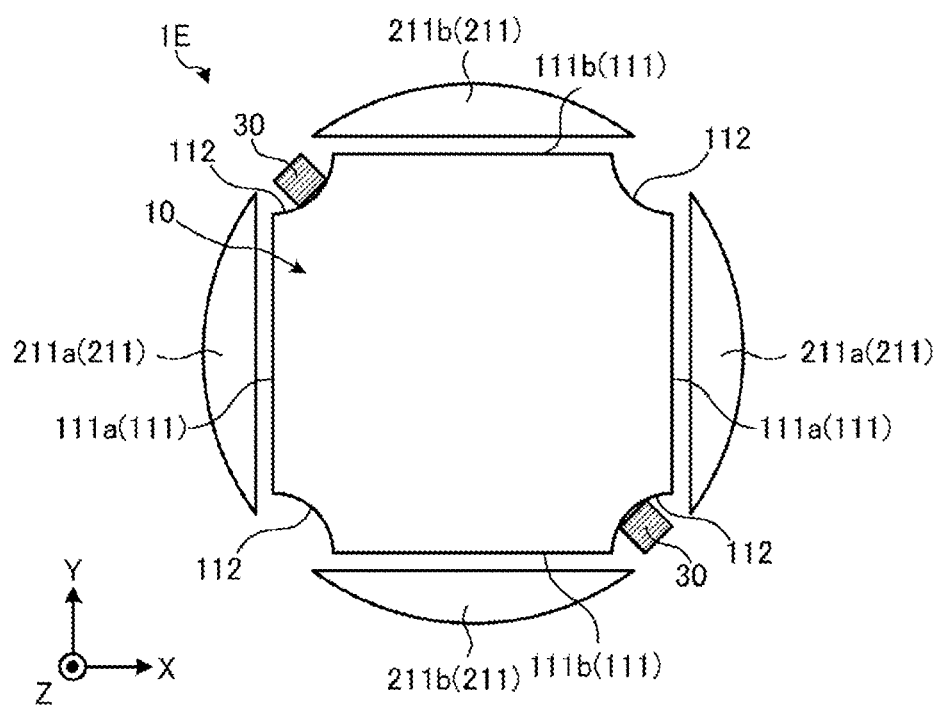
FIG. 11 is a schematic plan view of the lighting device according to the fifth modified example.

Next, a configuration of a lighting device according to a fifth modified example will be described with reference to FIGS. 10 and 11. FIGS. 10 and 11 are schematic plan views of the lighting device according to the fifth modified example. Note that the periphery of the corner portion 112 is illustrated enlarged in FIG. 10.

As illustrated in FIG. 10, in a lighting device 1E according to the fifth modified example, the electrically conductive terminal 30 is in contact with the corner portion 112. In this way, by bringing the electrically conductive terminal 30 into contact with the corner portion 112, the vibration of the electrically conductive terminal 30 can be suppressed by the substrate 10. Accordingly, the reliability in the vibration environment of the lighting device 1 can be further improved.

As illustrated in FIG. 11, the lighting device 1E according to the fifth modified example includes two electrically conductive terminals 30, and each of the two electrically conductive terminals 30 is located in a recessed region of corresponding one of the two corner portions 112 located diagonally. With such a configuration, a position shift of the substrate 10 due to vibration or the like can be suppressed by the two electrically conductive terminals 30. Specifically, in the corner portions 112, having the inverted-R shape can suppress not only the position shift in the diagonal direction in which the two electrically conductive terminals 30 are disposed, but also the position shift in a diagonal direction orthogonal to the diagonal direction in which the two electrically conductive terminals 30 are disposed, as compared with a case in which the corner portions have the C-plane shape. Accordingly, the reliability in the vibration environment of the lighting device 1 can be further improved.

Here, the example is given in which each of the electrically conductive terminals 30 is in contact with only corresponding one of the corner portions 112, but each of the electrically conductive terminals 30 may be in contact with the corresponding one of the corner portions 112 and also in contact with the side wall portions 211. Each of the electrically conductive terminals 30 may be in contact with the corresponding one of the corner portions 112 and also sandwiched by two side wall portions 211 adjacent to each other. In other words, each of the electrically conductive terminals 30 may be sandwiched by the corresponding one of the corner portions 112 and the two side wall portions 211 adjacent to each other.

SIXTH MODIFIED EXAMPLE

Figure 12:
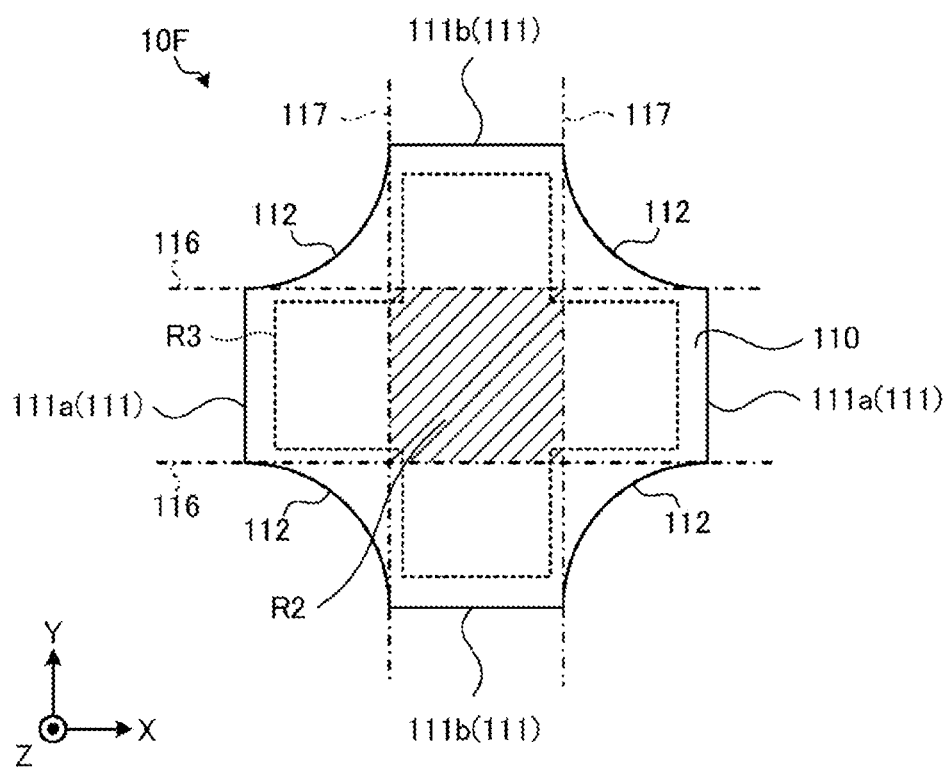
FIG. 12 is a schematic plan view of a substrate according to a sixth modified example.

Next, a configuration of a substrate according to a sixth modified example will be described with reference to FIG. 12. FIG. 12 is a schematic plan view of the substrate according to the sixth modified example.

As illustrated in FIG. 12, a region surrounded by two virtual lines 116 and 116 connecting end points of the first sides 111a facing each other and two virtual lines 117 and 117 connecting end points of the second sides 111b facing each other is defined as a region R2. In a substrate 10F according to the sixth modified example, a circuit mounting region R3 in the circuit forming surface 110 overlaps the region R2, and extends outward from the region R2. Specifically, the circuit mounting region R3 is longer than the region R2 in the X-axis direction and in the Y-axis direction.

As described above, by disposing the circuit mounting region R3 outward from the region R2, the circuit mounting region R3 can be more widely ensured in the substrate 10F including the inverted-R shaped corner portions 112. Note that the circuit mounting region R3 is a region in which the wirings 40, the light emitting element 50, and the like can be mounted.

As described above, the electronic device (for example, the lighting devices 1 and 1A to 1E) according to the embodiments includes a substrate made of a ceramic (for example, the substrates 10 and 10F), and a housing part (for example, the housing part 21 of the socket 20) including a recessed portion (for example, the recessed portion 210) for accommodating the substrate. The recessed portion includes a plurality of side wall portions (for example, the four side wall portions 211) arranged along the circumferential direction around the substrate, and respectively facing one of a plurality of sides (for example, the four sides 111) of the substrate in a plan view when viewing the substrate from a direction perpendicular to a circuit forming surface (for example, the circuit forming surface 110) of the substrate, and a plurality of gaps (for example, the four gaps 212) each located between two side wall portions adjacent to each other in the circumferential direction. The substrate includes a plurality of corner portions (for example, the four corner portions 112), curved toward an inner side of the circuit forming surface in a plan view.

As described above, with the electronic device according to the embodiments, by configuring the corner portions of the substrate in the inverted-R shape, damage to the corner portions of the substrate can be suppressed while using the housing part with the exposed corner portions of the substrate.

The electronic device according to the present disclosure is not limited to the lighting device and is applicable to various electronic devices other than the lighting device.

For example, the electronic device according to the present disclosure is applicable to a flowmeter, a mounted display monitor, such as on a smart watch, a power module such as an inverter, a converter, or the like, a power semiconductor such as on-board power control unit, battery components, secondary battery components, air conditioning systems (particularly for on-board applications), optical communication devices, laser projectors such as laser cinemas, laser machines, various sensor components, optical pickup components used for reading and writing a digital versatile disk (DVD) or a compact disk (CD), laser diode components, laser diode components, a central processing unit (CPU), a graphics processing unit (GPU), a tensor processing unit (TPU), and the like. In particular, the electronic device according to the present disclosure can be suitably used for a product in which the outer shape of the substrate is square (in a case where the inverted-R shape of the corner portions is ignored), and the outer shape of the housing part accommodating the substrate is circular.

Additional effects and variations can be easily derived by a person skilled in the art. Thus, a wide variety of aspects of the present invention are not limited to the specific details and representative embodiments represented and described above. Accordingly, various changes are possible without departing from the spirit or scope of the general inventive concepts defined by the appended claims and their equivalents.

REFERENCE SIGNS LIST

1 Lighting device
10 Substrate
110 Circuit forming surface
111 Side
112 Corner portion
20 Socket
21 Housing part
210 Recessed portion
211 Side wall portion
212 Gap
22 Flange part
23 Heat dissipating fin
30 Electrically conductive terminal
40 Wiring
45 Bonding wire
50 Light emitting element

The invention claimed is:

1. An electronic device comprising:
   a substrate made of a ceramic; and
   a housing part comprising a recessed portion configured to accommodate the substrate, wherein the recessed portion comprises
   a plurality of side wall portions arranged around the substrate along a circumferential direction and respectively facing a plurality of sides of the substrate in a plan view when viewing the substrate from a direction perpendicular to a circuit forming surface of the substrate, and
   a plurality of gaps each located between two of the plurality of side wall portions adjacent to each other in the circumferential direction,
   the substrate comprises a plurality of corner portions curved toward an inner side of the circuit forming surface in the plan view;
   wiring located on the circuit forming surface; and
   an electrically conductive terminal connected to the wiring, wherein at least a portion of the electrically conductive terminal is located in a recessed region of each of the plurality of corner portions.

2. The electronic device according to claim 1, wherein each of the plurality of side wall portions is longer than a facing one of the plurality of sides.

3. The electronic device according to claim 1, wherein the recessed region is a region surrounded by virtual extended lines of two of the plurality of sides adjacent to corresponding one of the plurality of corner portions and the corresponding one of the plurality of corner portions.

4. The electronic device according to claim 1, wherein each of the plurality of side wall portions is longer than the facing one of the plurality of sides, and shorter than a line segment connecting intersection points between a virtual extended line of the corresponding one of the plurality of sides and virtual extended lines of two of the plurality of sides adjacent to the corresponding one of the plurality of sides via the corresponding one of the plurality of corner portions.

5. The electronic device according to claim 1, wherein each of the plurality of side wall portions is longer than a line segment connecting intersection points between a virtual extended line of the facing one of the plurality of sides and virtual extended lines of two of the plurality of sides adjacent to the corresponding one of the plurality of sides via the corresponding one of the plurality of corner portions.

6. The electronic device according to claim 1, wherein the electrically conductive terminal is in contact with the plurality of side wall portions.

7. The electronic device according to claim 6, wherein the electrically conductive terminal is sandwiched between two of the plurality of side wall portions adjacent to each other.

8. The electronic device according to claim 1, further comprising: a plurality of the electrically conductive terminals, wherein the plurality of side wall portions and the plurality of electrically conductive terminals are alternately arranged at least in part in the circumferential direction.

9. The electronic device according to claim 1, further comprising: two of the electrically conductive terminals in contact with respective two of the plurality of corner portions located diagonally.

10. The electronic device according to claim 1, wherein the substrate comprises, in the plan view, a circuit mounting region outward of a region surrounded by two virtual lines connecting end points of two first sides facing each other of the plurality of sides and two virtual lines connecting end points of two second sides facing each other and orthogonal to the first sides of the plurality of sides.

* * * * *